(12) United States Patent
Manganaro

(10) Patent No.: US 7,042,374 B1
(45) Date of Patent: May 9, 2006

(54) CALIBRATION OF A CURRENT SOURCE ARRAY

(75) Inventor: Gabriele Manganaro, Boxborough, MA (US)

(73) Assignee: National Semiconductor Corporation, Santa Clara, CA (US)

(*) Notice: Subject to any disclaimer, the term of this patent is extended or adjusted under 35 U.S.C. 154(b) by 0 days.

(21) Appl. No.: 11/086,901

(22) Filed: Mar. 21, 2005

(51) Int. Cl.
*H03M 1/10* (2006.01)

(52) U.S. Cl. ...................... 341/120; 341/136
(58) Field of Classification Search ............... 341/136, 341/120, 133, 134, 144, 145, 118
See application file for complete search history.

(56) References Cited

U.S. PATENT DOCUMENTS

| | | | |
|---|---|---|---|
| 5,254,994 A * | 10/1993 | Takakura et al. ........... | 341/153 |
| 5,689,258 A * | 11/1997 | Nakamura et al. .......... | 341/136 |
| 6,608,578 B1 * | 8/2003 | Lee et al. ................... | 341/144 |

OTHER PUBLICATIONS

D. Wouter J. Groeneveld et al., "A Self-Calibration Technique for Monolithic High-Resolution D/A Converters," IEEE Journal of Solid-State Circuits, vol. 24, No. 6, Dec. 1989, pp. 1517-1522.

* cited by examiner

*Primary Examiner*—John B Nguyen
(74) *Attorney, Agent, or Firm*—Patent Law Group LLP; Carmen C. Cook

(57) ABSTRACT

A current source cell includes a current source providing a first current where the first current can be calibrated, first and second switches coupled to steer the first current to respective first and second output terminals in response to respective first and second control signals, and a latch circuit generating the first and second control signals. The latch circuit drives the first and second control signals to a first logical state to cause the first and second switches to open. The first current is then calibrated. After calibration, the latch circuit drives the first and second control signals to have logical states that correspond to a data signal as triggered by a clock signal where the first and second control signals have inverse logical states. One of the first and second switches is closed to steer the first current to a respective one of the first and second output terminals.

20 Claims, 7 Drawing Sheets

TABLE 1

| $W_N$ | $Y_1^+$ | $Y_2^+$ |
|---|---|---|
| 0 | $D_N$ | $\overline{D}_N$ |
| 1 | 1 | 1 |

CALIBRATION OF A CURRENT SOURCE ARRAY

FIELD OF THE INVENTION

The invention relates to a method and an apparatus for calibrating a current source array, and in particular, to a method and an apparatus for performing background calibration of a current source array.

DESCRIPTION OF THE RELATED ART

Modern high speed digital-to-analog converter architectures are often based on arrays of identical or properly sized current source cells. Each current source cell includes a current source whose output current is steered toward a negative or a positive output terminal depending on the digital data signal driving the current source cell. In an array of current source cells forming a digital-to-analog converter, a set of digital control bits drives the associated current source cells to steer the output current of each current source cell so as to produce the desired digital-to-analog converted result at the positive and negative output terminals.

The linearity of the digital to analog conversion using such a current source array architecture relies on the relative matching of the individual current sources in each of the current source cells of the array. When the individual matching of the current sources cannot be guaranteed to the desired level of precision due to manufacturing inaccuracies, calibration or trimming techniques are applied to improve the precision of the current source. Calibration or trimming operation ensures the deviation of each source current from a reference value is reduced to a desired amount after the digital-to-analog converter devices have been fabricated.

A commonly used analog background calibration method for an array of current source cells uses a spare current source switchably connected to the current source cells to facilitate the calibration. FIG. 1 is a circuit diagram of a conventional current source cell in a PMOS based implementation. Referring to FIG. 1, current source cell 10 includes a current source providing a source current $I_T$ at a node 12. In the present illustration, the current source is implemented using PMOS transistors $M_{CS}$ and $M_M$. In the following description, transistor $M_{CS}$ will be referred to as the "current source device" while transistor $M_M$ will be referred to as the "memory device." Current source device $M_{CS}$ is biased by a DC voltage $V_{b1}$ to provide a certain amount of drain current to node 12. The gate and drain terminals of memory device $M_M$ are switchably connected a node A to also provide a certain amount of drain current to node 12. The source current $I_T$ is the sum of the drain currents of transistors $M_{CS}$ and $M_M$.

In operation, transistor $M_{CS}$ provides a base current value for source current $I_T$. Transistor $M_M$ is biased to provide a correction factor so that the total current value at node 12 is the desired source current $I_T$. In an array of current source cells, the base current value provided by the current source device $M_{CS}$ in each current source cell will vary due to device mismatches. Memory device $M_M$ is biased in a manner to provide just the sufficient amount of correction current so that the total source current $I_T$ at node 12 for each current source cell in the array is the same. Typically, current source device $M_{CS}$ provides about 70% of the total current $I_T$ while memory device $M_M$ provides the remaining 30%.

The current source of current source cell 10 also includes an output device. Most commonly, a cascode transistor $M_C$ is used as shown in FIG. 1. Cascode device $M_C$ provides the output source current $I_O$ to a current output node 14. In the configuration shown in FIG. 1, cascode transistor $M_C$ provides a DC output impedance magnification approximately equal to its so-called intrinsic gain $g_{Mc}/g_{dsc}$, where $g_{Mc}$ is the transconductance of transistor $M_C$ and $g_{dsc}$ is the conductance looking into the drain terminal of transistor $M_C$. The cascode transistor thus realizes a magnification of the impedance looking into the current source.

In current source cell 10, the output source current $I_O$ is steered completely toward a positive output terminal O1 or a negative output terminal O2 by means of a source-coupled pair of transistors $M_{S1}$ and $M_{S2}$. The source-coupled pair of transistors $M_{S1}$ and $M_{S2}$ function as the current steering switches. The output source current $I_O$ is steered into the desired output terminal (O1 or O2) by a control signal Q which is the output state of a latch 16. Latch 16 receives a digital data signal D as input signal and switches the output state Q and its inverse (Q\) following the clock signal CLK. In this manner, the digital data signal D is converted to an analog current signal by the operation of latch 16 and current steering switches $M_{S1}$ and $M_{S2}$.

Specifically, control signal Q is coupled to drive transistor $M_{S1}$ while the inverse control signal Q\ is coupled to drive transistor $M_{S2}$. Thus, for any given data signal D, only one of transistors $M_{S1}$ and $M_{S2}$ will be turned on to allow the output source current $I_O$ to flow to the respective output terminal O1 or O2. In this manner, by turning on one of transistors $M_{S1}$ and $M_{S2}$, the output source current $I_O$ is steered to one of the output terminals O1 and O2.

In an array of current source cells, the output terminals O1 of all the current source cells in the array are coupled together while the output terminals O2 of all the current source cells in the array are coupled together. A data signal $D_K$ drives each of the current source cells and determines the total output current values for a positive output current at output terminal O1 and a negative output current at output terminal O2 for the array.

The basic calibration scheme for current source cell 10 is to program the gate-to-source voltage $V_{GS}$ of memory device $M_M$ to force the source current $I_T$ to be at the desired current level. The capacitance between the gate terminal and the source terminal of transistor $M_M$ will hold the programmed voltage but the programmed gate-to-source voltage will slowly discharge over time. The $V_{GS}$ voltage of memory device $M_M$ will then need to be periodically refreshed to maintain the total source current $I_T$ at the desired level. To implement the current source calibration, switches $S_1$, $S_2$, $S_3$, and $S_4$ are include in current cell 10. Specifically, switch $S_1$ is coupled to connect the gate terminal of memory device $M_M$ to node A while switch $S_3$ is coupled to connect the drain terminal of memory device $M_M$ to node A. Switch $S_2$ is coupled to connect the source current IT (node 12) to the cascode device $M_C$. Switch $S_4$ is coupled to connect the source terminal (node 13) of cascode device $M_C$ to a node C.

In order to perform the background calibration of the current source cells, a so-called "spare current source" is used. FIG. 2 is a circuit diagram of a spare current source 18 which can be coupled to current source cell 10 of FIG. 1 to facilitate background calibration. Spare current source 18 basically duplicates the current source circuitry of current source cell 10. In other words, spare current source 18 has identical circuitry to that of current source cell 10 at and above switch $S_2$. Referring to FIG. 2, spare current source 18 includes transistor $M_{CS\_P}$ as the current source device and transistor $M_{M\_P}$ as the memory device. A source current $I_{T\_P}$ is provided at the common source node of transistors $M_{CS\_P}$ and $M_{M\_P}$. Transistor $M_{CS\_P}$ is biased by voltage $V_{b1}$, the same voltage driving transistor $M_{CS}$ of current source cell 10. The gate and drain terminals of transistor $M_{M\_P}$ are switchably connected to a node A through switches $S_{1\_P}$ and $S_{3\_P}$. The source current $I_{T\_P}$ is provided to node C through switch $S_{2\_P}$.

FIGS. 3A and 3B are circuit diagrams illustrating the coupling of a single spare current source, such as spare current source 18 of FIG. 2, to a single current source cell, such as current source cell 10 of FIG. 1, for explaining the background calibration process of the current source cell. First, FIG. 3A illustrates the calibration of spare current source 18. Referring to FIG. 3A, to calibrate spare current source 18, switches $S_{1\_P}$ and $S_{3\_P}$ are closed to connect the gate and drain terminals of memory device $M_{M\_P}$ to node A. Node A, which is common to the spare current source 18 and the current source cell 10, is coupled to a reference current $I_{REF}$. When switches $S_{1\_P}$ and $S_{3\_P}$ are closed, the reference current $I_{REF}$ is forced into node A so that source current $I_{T\_P}$ is forced to equal to current $I_{REF}$. Hence, the gate-to-source potential of memory device $M_{M\_P}$ settles to a voltage that ensures that current $I_{\_P}$ is equal to current $I_{REF}$. At this time, switch $S_{2\_P}$ is open and switch $S_4$ is also open to isolate spare current source 18 from current source cell 10. Spare current source 18 is thus calibrated to cancel device mismatch due to fabrication variation of transistors $M_{CS\_P}$ and $M_{M\_P}$.

Meanwhile, current source cell 10 is operating in the active mode to provide a code dependent output value at output terminals O1 and O2 based on the state of data signal D. In current source cell 10, switches $S_1$ and $S_3$ are open and switch $S_2$ is closed so that source current $I_T$ flows through switch $S_2$ (on) into the cascode device $M_C$. The output source current $I_O$ thus equals current $I_T$. Output source current $I_O$ is steered through transistor $M_{S1}$ or $M_{S2}$ depending on the value of Q and its inverse.

FIG. 3B illustrates the calibration of current source cell 10. To calibrate current source cell 10, switches $S_1$ and $S_3$ are closed and the reference current $I_{REF}$ coupled to node A is forced into the gate and drain terminals of memory device $M_M$. Source current $I_T$ is thus forced to current $I_{REF}$ and the gate-to-source voltage of memory device $M_M$ is thus programmed. While current source cell 10 is being calibrated, switch $S_2$ is open so that current source cell 10 does not provide a source current to the cascode device $M_C$. Instead, switches $S_{2\_P}$ and $S_4$ are closed to direct the previously calibrated current at spare current source 18 to the cascode device $M_C$. In this manner, current source cell 10 can remain operational to the external circuitry where the output source current $I_O$ is steered through source-coupled pair of transistors $M_{S1}$, $M_{S2}$ toward one of the output terminals O1 and O2 depending on the value of data signal D.

Thus, by periodically alternating the spare source calibration (FIG. 3A) and the current source cell calibration (FIG. 3B), source currents $I_{T\_P}$ and $I_T$ are being matched to reference current $I_{REF}$ while a calibrated output source current $I_O$ is simultaneously made available for code dependent steering toward the desired output terminal. The calibration process described with respect to FIGS. 3A and 3B can be extended to an array of K current source cells using a single spare current source as shown in FIG. 4A using the timing diagram shown in FIG. 4B.

For instance, the spare current source is calibrated first while the K current source cells are operating to provide their respective source currents $I_{T\_N}$ (N=1, ..., K) to the respective cascode devices. When the calibration of the spare current source is completed, the current source cell 1 is calibrated while the spare current source provides the calibrated spare source current $I_{T\_P}$ to the cascode device $M_{C\_1}$ of current source cell 1. Current source cell 1 thus remains operational to the external circuitry. When calibration of current source cell 1 is completed, current $I_{T\_1}$ is reconnected to its cascode device $M_{C\_1}$ and the next current source cell can then be calibrated, with the spare source current $I_{T\_P}$ being coupled to drive the cascode device of the current source cell being calibrated. The calibration process is performed cell by cell in a periodic fashion following the timing diagram of FIG. 4B showing the logical states of the switches in the array of current source cells.

The implementation of the conventional calibration scheme has many limitations and disadvantages.

First, the conventional calibration scheme uses switches (such as switches $S_{2\_P}$, $S_{2\_1}$ to $S_{2\_K}$, and $S_{4\_1}$ to $S_{4\_K}$ in FIG. 4) in the analog signal path where the output current of the current source flows. These switches display non-ideal characteristics arising from the actual implementation of the switches and these non-ideal characteristics often result in degradation of the performance of the current source cells. Switches in an integrated circuit are typically implemented using MOS or bipolar transistors. Such switches, regardless of their actual method of implementation, will suffer from numerous non-ideal characteristics, including but not limited to finite on-resistance $R_{ON}$, finite parasitic terminal to ground capacitance (at either of the two switch terminals), and finite terminal-to-terminal capacitance.

The finite on-resistances of the $S_2$ switches ($S_{2\_P}$, $S_{2\_1}$ to $S_{2\_K}$) will cause a voltage drop across the switches themselves, affecting the drain potential of the associated current source devices ($M_{CS\_1}$ to $M_{CS\_K}$) and memory devices ($M_{M\_1}$ to $M_{M\_K}$) in the current source cells. Since the on-resistances of the $S_2$ switches are not calibrated to match, mismatches in the drain potentials resulted from mismatches of the on-resistance of the $S_2$ switches will introduce new mismatches in the source currents $I_T$ of each current source cell in an array of current source cells. Similarly, the mismatch in the on-resistances of the $S_4$ switches (switch $S_{4\_1}$ to $S_{4\_K}$) will change the spare source current $I_{T\_P}$ provided to each cell as the spare source current is used to substitute the source current for a cell under calibration.

In order to reduce the switches' on-resistance to a negligible level, the size of the actual switches needs to be increased. Increasing the size of the actual switches magnifies the parasitic capacitances associate with the switches, as will be discussed in more detail below.

Second, the wiring used to connect the $S_4$ switches ($S_{4\_1}$ to $S_{4\_K}$) to node C also suffers from finite resistance as well as capacitance to ground and to adjacent conductors. The finite resistance of the wiring will result in variation of the spare source current $I_{T\_P}$ provided to each current source cell under calibration in the same manner the finite on-resistances of the $S_4$ switches causes variations of the spare source current $I_{T\_P}$.

Third, parasitic capacitances associated with the switches and the wiring in the circuit degrade the high frequency performance of the digital-to-analog conversion. At high frequency, all voltage variations across such capacitances, due to the circuit operation, cause the flow of displacement currents through the capacitances. Hence, switches that are turned off may still allow some transient current to flow across their terminal-to-terminal parasitic capacitance. Transient current flowing through the parasitic capacitances introduced by the switches causes undesired coupling between the switches' two terminals, the power supplies, and all physically adjacent conductors.

Finally, the parasitic capacitances associated with the wiring between node C and the $S_4$ switches can in practice significantly reduce the overall performance of the array in proportion to the size of such array.

The non-ideal characteristics discussed above result in degradation of the performance of the digital-to-analog converter formed using such an array of current source cells. In view of the above limitations and disadvantages, it is therefore desirable to provide a calibration scheme for a current source cell array which overcomes the aforementioned limitations and disadvantages of the conventional calibration scheme.

SUMMARY OF THE INVENTION

According to one embodiment of the present invention, a current source cell includes a current source providing a first current to a first node where the current source is capable of being calibrated to provide the first current having a substantially constant value, a first switch coupled between the first node and a first output terminal and having a control terminal driven by a first control signal, a second switch coupled between the first node and a second output terminal and having a control terminal driven by a second control signal, and a latch circuit receiving a data input signal, an output override control signal, and a clock signal where the latch circuit generates the first control signal and the second control signal as output signals. When the output override control signal is asserted, the first control signal and the second control signal are driven by the latch circuit to a first logical state to cause the first and second switches to open. When the output override control signal is deasserted, the first control signal and the second control signal are driven by the latch circuit to have logical states that correspond to the data input signal as triggered by the clock signal where the first and second control signals have inverse logical states. In this manner, one of the first and second switches is caused to close to steer the first current to a respective one of the first and second output terminals.

According to another embodiment of the present invention, a current source array includes one or more current source cells and at least one spare current source cell ("spare cell"). Each of the one or more current source cells and the at least one spare cell includes a current source providing a first current to a first node where the current source is capable of being calibrated to provide the first current having a substantially constant value, a first switch coupled between the first node and a first output terminal and having a control terminal driven by a first control signal, a second switch coupled between the first node and a second output terminal and having a control terminal driven by a second control signal, and a latch circuit having a data input terminal receiving a data signal, a control terminal receiving an output override control signal, and a clock terminal receiving a clock signal. The latch circuit generates the first control signal and the second control signal as output signals.

In each of the one or more current source cells and the at least one spare cell, when the output override control signal is asserted, the first control signal and the second control signal are driven by the latch circuit to a first logical state to cause the first and second switches to open. When the output override control signal is deasserted, the first control signal and the second control signal are driven by the latch circuit to have logical states that correspond to the data signal as triggered by the clock signal where the first and second control signals have inverse logical states, thereby causing one of the first and second switches to close to steer the first current to a respective one of the first and second output terminals. Each of the one or more current source cells and the spare cell receives a respective output override control signal and each of the one or more current source cells receives a respective data signal.

The current source array further includes a data bus coupled to the data input terminal of the latch circuit of the spare cell and switchably coupled to the data input terminals of the latch circuits of the one or more current source cells, a first array output terminal connecting the first output terminals of the one or more current source cells and the at least one spare cell together providing a first output current, and a second array output terminal connecting the second output terminals of the one or more current source cells and the at least one spare cell together providing a second output current.

In operation, each of the one or more current source cells is calibrated in turn to maintain the first current of each current source cell at a substantially constant value. The current source cell being calibrated is disabled by asserting the output override control signal to cause the first and second switches of the current source cell under calibration to open and the spare cell is activated to substitute for the current source cell being calibrated by deasserting the output override control signal for the latch circuit of the spare cell and connecting the data input terminal of the latch circuit of the current source cell being calibrated to the data bus.

According to another aspect of the present invention, a method for calibrating a current source cell includes providing a first current at a first node where the first current is capable of being calibrated to maintain the first current at a substantially constant value, steering the first current to a selected one of first and second current paths in accordance with a data signal where the first current path is controlled by a first control signal and the second current path is controlled by a second control signal, asserting the first and second control signals to disable the first and second current paths, calibrating the first current to maintain the first current at a substantially constant value, and after the first current is calibrated, asserting one of the first and second control signals in accordance with the data signal to steer the first current to a selected one of first and second current paths.

According to another aspect of the present invention, a method for calibrating a current source array includes providing one or more current source cells and at least one spare current source cell ("spare cell") to form the current source array. Each of the one or more current source cells and the at least one spare cell provides a first current at a first node where the first current is capable of being calibrated to maintain the first current at a substantially constant value. The method further includes, in each of the one or more current source cells and the at least one spare cell, steering the first current to a selected one of first and second current paths in accordance with a data signal where the first current path is controlled by a first control signal and the second current path is controlled by a second control signal, providing a respective data signal to each of the one or more current source cells, summing the current in the first current paths of the one or more current source cells and the at least one spare cell as a first output signal, summing the current in the second current paths of the one or more current source cells and the at least one spare cell as a second output signal.

The method further includes calibrating the first current of each of the one or more current source cells in turn, including asserting the first and second control signals associated with the current source cell being calibrated to disable the first and second current paths of the current source cell being calibrated, calibrating the first current of the current source cell being calibrated to maintain the first current at a substantially constant value, coupling the data signal associated with the current source cell being calibrated to the spare cell as the data signal of the spare cell, asserting one of the first and second control signals of the spare cell in accordance with the data signal to steer the first current to a selected one of first and second current paths of the spare cell. After the first current of the current source cell being calibrated is calibrated, the method includes decoupling the data signal associated with the calibrated current source cell from the spare cell, asserting one of the first and second control signals of the calibrated current source cell in accordance with the respective data signal to steer the first current to a selected one of first and second current paths of the calibrated current source cell.

The present invention is better understood upon consideration of the detailed description below and the accompanying drawings.

DETAILED DESCRIPTION OF THE PREFERRED EMBODIMENTS

In accordance with the principles of the present invention, a calibration scheme for an array of current source cells uses a spare current source cell that is configured identical to the current source cells and operates to substitute the current generating as well as the current steering operations of a current source cell under calibration. The current source cells in the array and the spare current cell utilize a latch circuit with output override capability to allow the spare current source cell to be switched in for the current source cell under calibration. A data bus carries the data signal of the current source cell being calibrated to the spare cell, thereby allowing the spare cell to imitate the current source cell being calibrated. When the array of current source cells is configured to form a current steering digital-to-analog converter, background calibration of the current source cells is performed without degradation of the performance of the digital-to-analog converter.

A main advantage of the calibration scheme of the present invention is that the current source cells and the spare current source cell ("spare cell") do not include switches in the analog signal path. As compared to the conventional calibration scheme, the $S_2$ switches and $S_4$ switches that are in the source current path are eliminated in the current source cells and spare cell of the present invention. Therefore, the calibration scheme of the present invention avoids many of the disadvantages associated with the non-ideal characteristics of switches that are interposed in the analog signal path. Another main advantage of the calibration scheme of the present invention is that the current source cells and the spare cell do not rely on wiring to redirect the spare source current to the cell under calibration. Instead, a digital data bus is used to carry the digital data signals to the spare cell. Therefore, the calibration scheme of the present invention avoids the disadvantages associated with the non-ideal characteristics of using extended wiring in the analog signal path, as discussed above.

Figure 1:
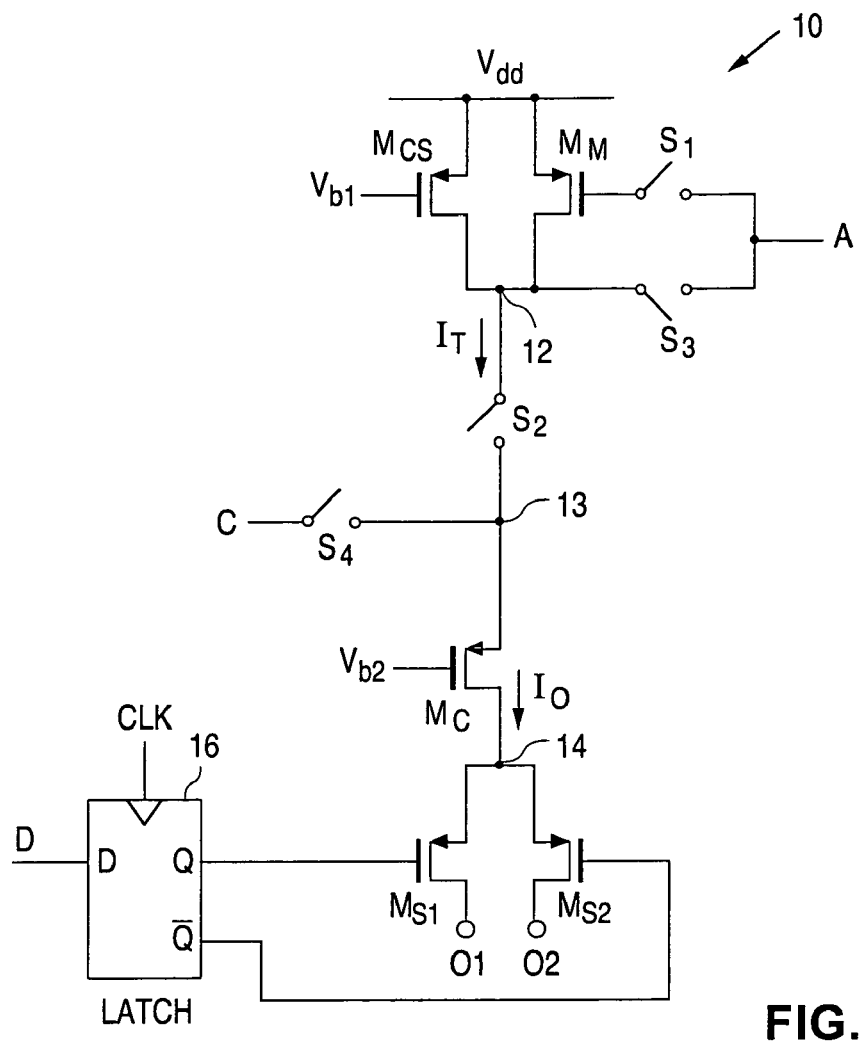
FIG. 1 is a circuit diagram of a conventional current source cell in a PMOS based implementation.
Figure 2:
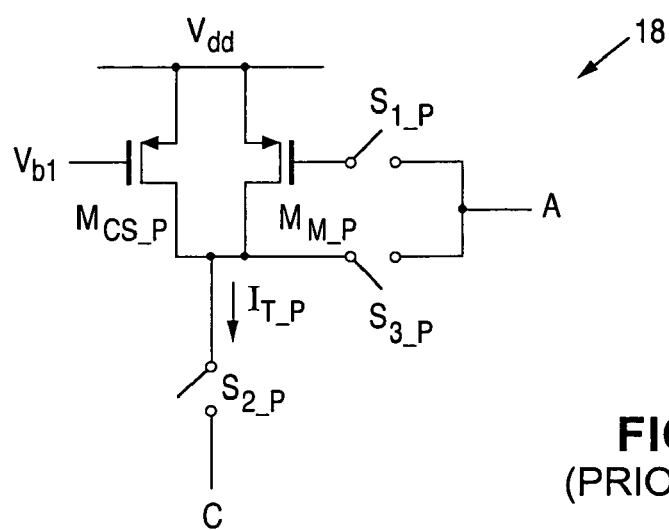
FIG. 2 is a circuit diagram of a spare current source which can be coupled to the current source cell of FIG. 1 to facilitate background calibration.
Figure 3A:
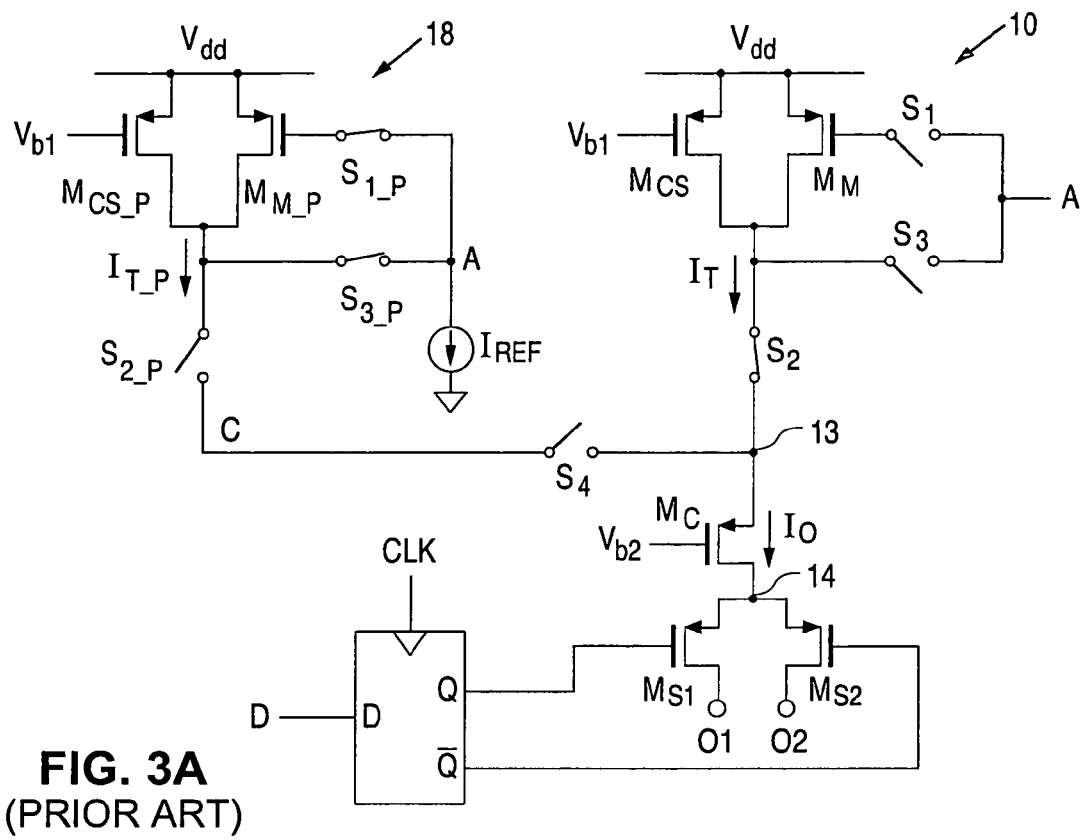
FIGS. 3A and 3B are circuit diagrams illustrating the coupling of a single spare current source, such as the spare current source of FIG. 2, to a single current source cell, such as the current source cell of FIG. 1, for explaining the background calibration process of the current source cell.
Figure 3B:
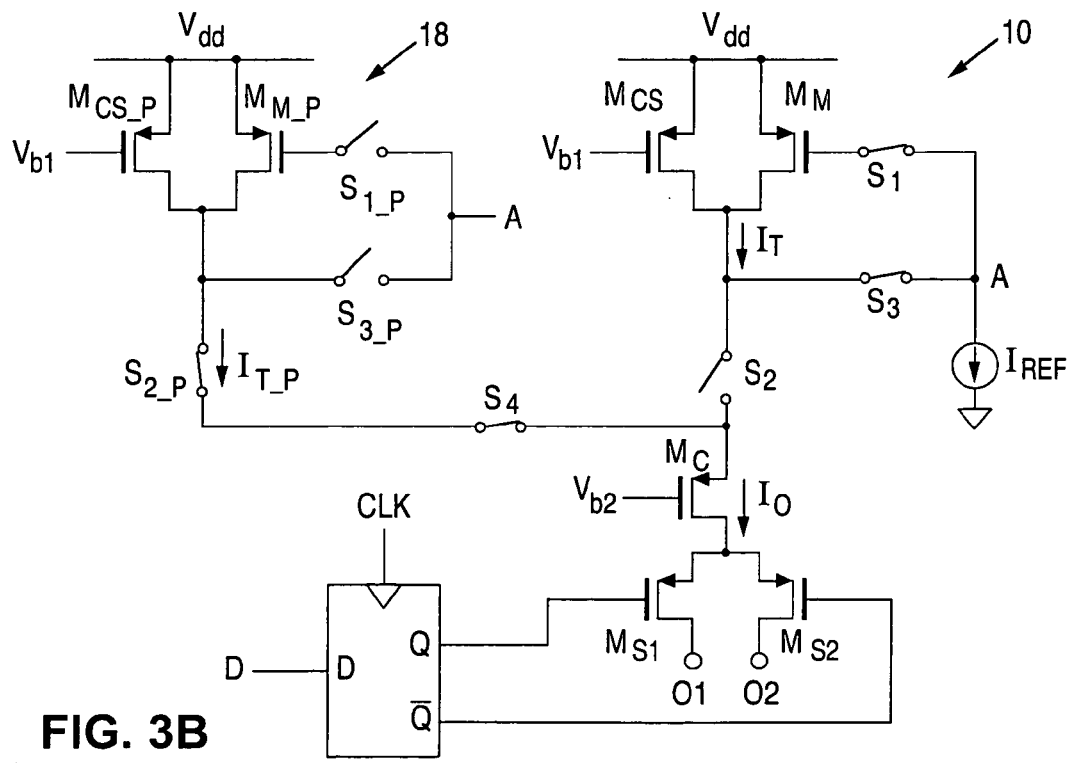
Figure 4A:
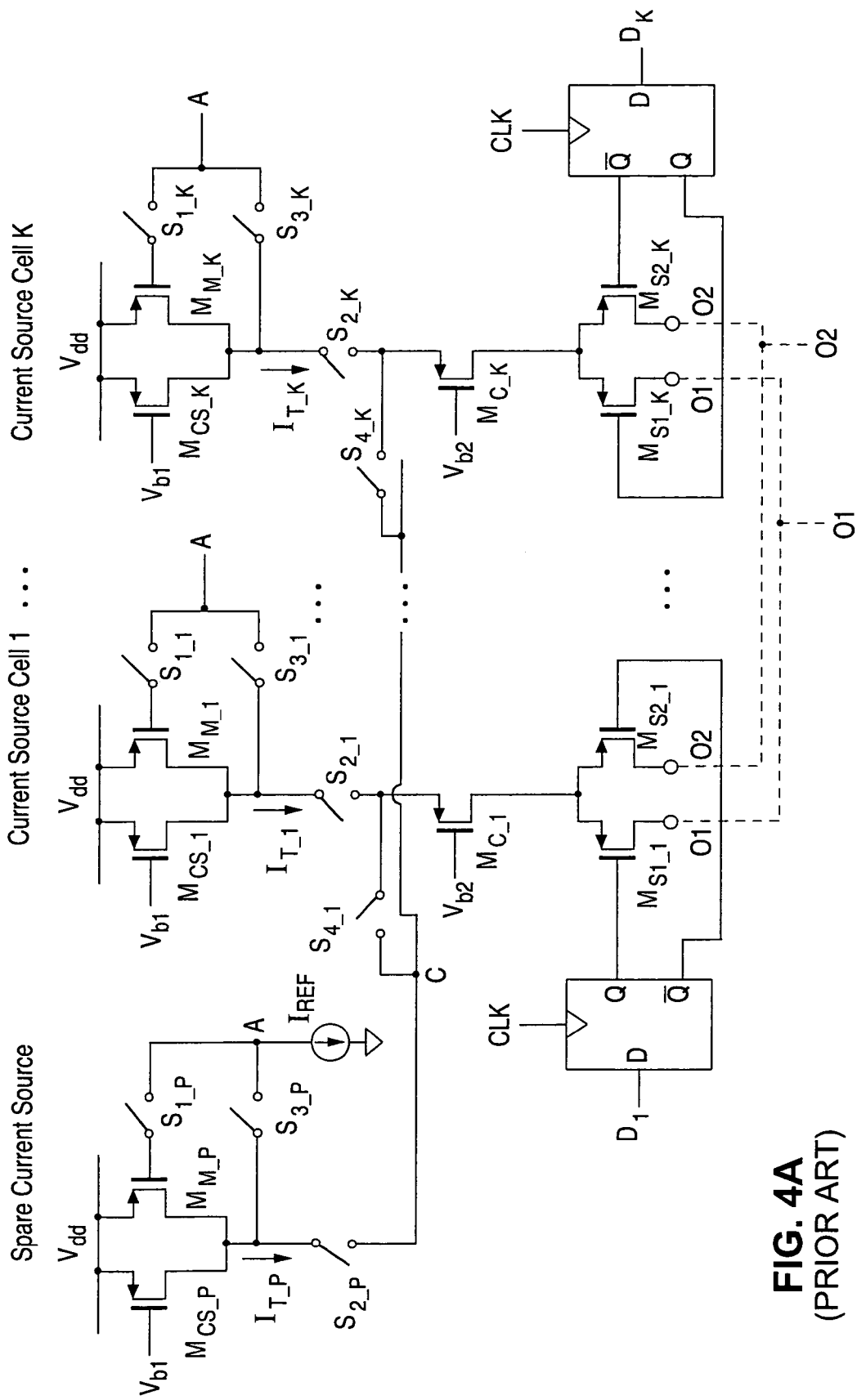
FIG. 4A is a circuit diagram illustrating an array of K current source cells and a single spare current source for implementing the conventional calibration process.
Figure 4B:
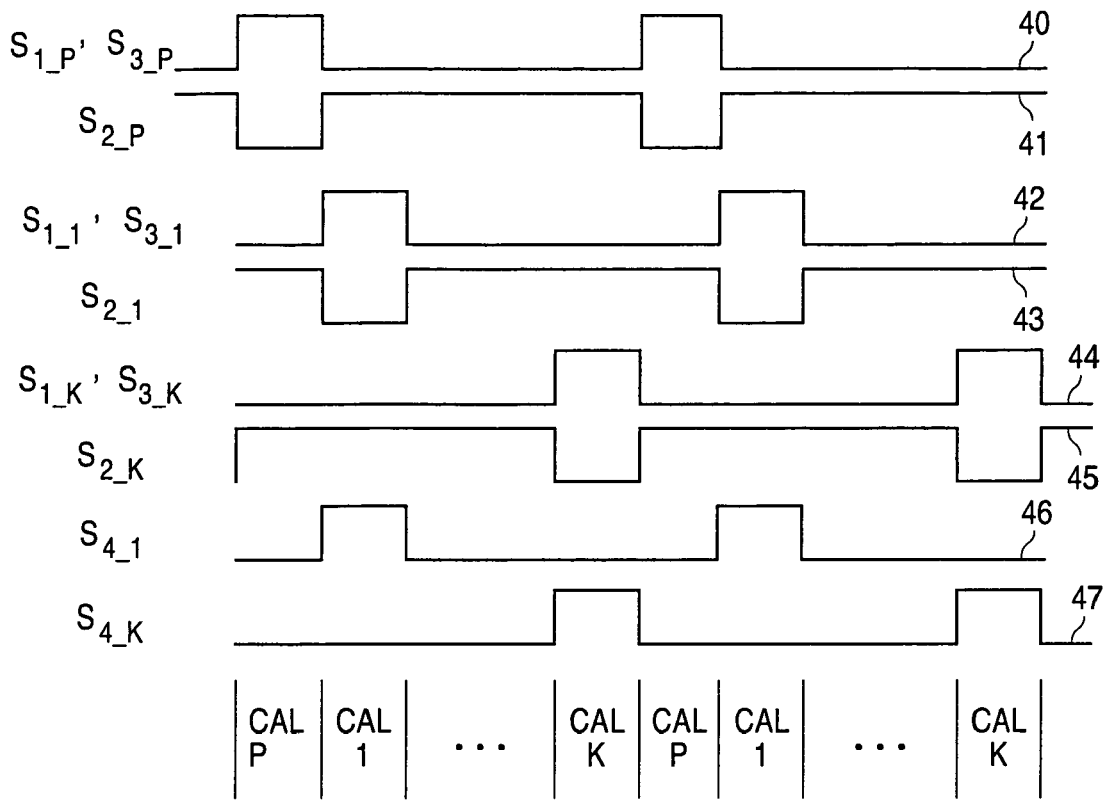
FIG. 4B is a timing diagram for performing the calibration process in the circuit of FIG. 4A.
Figures 5, 6:
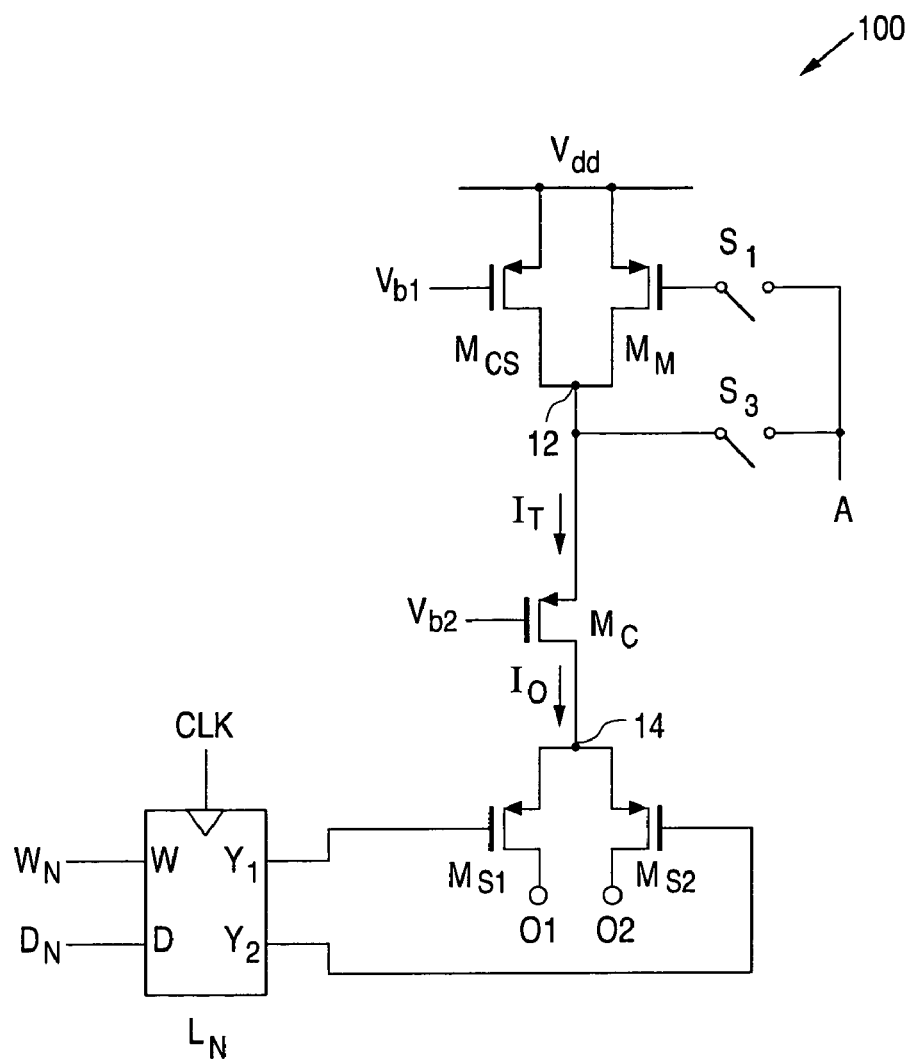
FIG. 5 is a circuit diagram of a current source cell according to one embodiment of the present invention.
FIG. 6 is a truth table of an output overrideable latch $L_N$ used in the current source cell of FIG. 5 according to one embodiment of the present invention.

FIG. 5 is a circuit diagram of a current source cell according to one embodiment of the present invention. In the embodiment shown in FIG. 5, the current source cell is constructed in a PMOS based implementation. One of ordinary skill in the art, upon being apprised of the present invention, would appreciate that the current source cell can also be implemented using NMOS transistors, or NPN bipolar transistors or PNP bipolar transistors. The voltage polarities of the current source cell can be accordingly modified when NMOS transistors or NPN bipolar transistors are used. Current source cell 100 of FIG. 5 is constructed in a similar manner as the current source cell of FIG. 1 and like elements are given like reference numerals to simplify the discussion. Current source cell 100 of the present invention can be formed in an array to realize a current steering digital-to-analog converter. Thus, current source cell 100 in FIG. 5 is representative of any one of the current source cells in an array of current source cells.

Referring to FIG. 5, current source cell 100 in accordance with the present invention includes a current source providing a source current $I_T$ at a node 12. In the present embodiment, the current source is implemented using a PMOS transistor $M_{CS}$ as the current source device and a PMOS transistor $M_M$ as the memory device. Current source device $M_{CS}$ is biased by a DC voltage $V_{b1}$ to provide a drain current having a first value to node 12. The gate and drain terminals of memory device $M_M$ are switchably connected a node A to provide a drain current having a second value to node 12. Specifically, a switch $S_1$ is coupled to connect the gate terminal of memory device $M_M$ to a node A while a switch $S_3$ is coupled to connect the drain terminal of memory device $M_M$ to node A. Switches $S_1$ and $S_3$ are closed to program the gate-to-source voltage of transistor $M_M$ to a desired level to provide the drain current having the second value. The source current $I_T$ is the sum of the drain currents of transistors $M_{CS}$ and $M_M$.

In operation, transistor $M_{CS}$ provides a base current value for source current $I_T$. Transistor $M_M$ is biased with a given gate-to-source voltage to provide a correction factor so that the total current value at node 12 is the desired source current $I_T$. As described above, in an array of current source cells, the base current value provided by the current source device $M_{CS}$ in each current source cell will vary due to device mismatches. Memory device $M_M$ is biased in a manner to provide just the sufficient amount of correction current so that the total source current $I_T$ at node 12 for each current source cell in the array is the same. Typically, current source device $M_{CS}$ provides about 70% of the total current $I_T$ while memory device $M_M$ provides the remaining 30%.

The current source of current source cell 100 also includes an output device. In the present embodiment, the output device is a cascode transistor $M_C$ having a source terminal connected directly to node 12 for receiving the source current $I_T$. That is, cascode transistors $M_C$ is connected to the current source device and memory device of the current source without any intervening switches. Cascode device $M_C$ provides an output source current $I_O$ to a current output node 14. Cascode transistor $M_C$ provides a DC output impedance magnification as described above.

In current source cell 100, the output current $I_O$ is steered into one of two current paths formed by a pair of current steering switches. Specifically, the output source current $I_O$ is steered completely toward a positive output terminal O1 or a negative output terminal O2 by means of a source-coupled pair of transistors $M_{S1}$ and $M_{S2}$. The source-coupled pair of transistors $M_{S1}$ and $M_{S2}$ function as the current steering switches. The output source current $I_O$ is steered into the desired output terminal (O1 or O2) by a first control signal $Y_1$ and a second control signal $Y_2$ which are the output states of a latch $L_N$. Latch $L_N$ responds in part to a data signal $D_N$ and switches the first and second control signals $Y_1$ and $Y_2$ in accordance with the data signal $D_N$ following the clock signal CLK. First control signal $Y_1$ is coupled to drive transistor $M_{S1}$ while second control signal $Y_2$ is coupled to drive transistor $M_{S2}$. When latch $L_N$ is in active operation, as will be explained below, first control signal $Y_1$ and second control signal $Y_2$ have inverse logical states. Thus, for any given data signal $D_N$, only one of transistors $M_{S1}$ and $M_{S2}$ will be turned on to allow the output source current $I_O$ to flow to the respective output terminal O1 or O2. In this manner, by turning on one of transistors $M_{S1}$ and $M_{S2}$, the output source current $I_O$ is steered to one of the output terminals O1 and O2. The digital data signal $D_N$ is then converted to an analog current signal by the operation of latch $L_N$ and current steering switches $M_{S1}$ and $M_{S2}$.

Current source cell 100 utilizes an output overrideable latch circuit as latch $L_N$. Latch $L_N$ receives a digital data signal $D_N$ as the data input signal, a clock signal CLK and an output override control signal $W_N$. FIG. 6 is a truth table of an output overrideable latch $L_N$ according to one embodiment of the present invention. Latch $L_N$ is in an active operation mode and operates as a normal latch when the output override control signal $W_N$ is not asserted. In the present embodiment, control signal $W_N$ is not asserted (deasserted) when the signal is at a logical low state. Thus, referring to the truth table in FIG. 6, when control signal $W_N$ is at a logical low state, the first output signal $Y_1$ follows the data signal $D_N$ while the second output signal $Y_2$ follows the inverse of the data signal $D_N$ following the control of clock signal CLK. In the present embodiment, output signals $Y_1$ and $Y_2$ switches on the rising edge of clock signal CLK.

Latch $L_N$ can be placed in an inactive mode by asserting the output override control signal $W_N$. When output override control signal $W_N$ is asserted, that is, at a logical high state in the present embodiment, the first output signal $Y_1$ and the second output signal $Y_2$ are both forced to a logical high state. In current source cell 100, current steering switches $M_{S1}$ and $M_{S2}$ are both PMOS transistors. Therefore, the current steering switches $M_{S1}$ and $M_{S2}$ will be forced to turn off (or open) when their control signals $Y_1$ and $Y_2$ are at a logical high state. Therefore, when latch $L_N$ is operated in the inactive mode, control signals $Y_1$ and $Y_2$ are provided to disable both of the current steering switches in current source cell 100. Current source cell 100 is thus disabled from providing current steering outputs and this operation state can be advantageous utilized for performing calibration of the current source cell.

The output overrideable latch circuit of current source cell 100 can be implemented in many different ways, as will be described in more detail below. It is instructive to note that the specific logical states used in the present embodiment of latch $L_N$ are exemplary and that the polarities of the output override control signal and the output signals can be changed depending on the actual implementation of the output overrideable latch circuit and the current source cell. The truth table for latch $L_N$ in FIG. 6 is illustrative only. The exact logical state polarities of the control signals and the output signals are not critical to the implementation of the current source cell and the calibration scheme of the present invention. For instance, the output override control signal $W_N$ can be asserted at a logical low state and deasserted at a logical high state. Also, output signals $Y_1$ and $Y_2$ can be forced to a logical low state when the current steering switches respond to logical low control signals to turn off the switches. For example, when the current steering switches are implemented as NMOS transistors or NPN bipolar transistors, latch $L_N$ will force output signal $Y_1$ and $Y_2$ to a logical low state when the latch is put in the inactive mode.

Returning to FIG. 5, in an array of current source cells, the output terminals O1 of all the current source cells in the array are coupled together while the output terminals O2 of all the current source cells in the array are coupled together. A data signal $D_N$ drives each of the current source cells and determines the total output current values for a positive output current at output terminal O1 and a negative output current at output terminal O2 for the array.

The basic calibration scheme for current source cell 100 is to program the gate-to-source voltage $V_{GS}$ of memory device $M_M$ to force the source current $I_T$ to be at the desired current level. Specifically, to calibrate current source cell 100, switches $S_1$ and $S_3$ are closed to connect the gate and drain terminals of memory device $M_M$ to node A. Node A is coupled to a reference current source to provide a reference current $I_{REF}$. The reference current $I_{REF}$ is forced into node A so that source current $I_T$ is forced to equal to current $I_{REF}$. Hence, the gate-to-source voltage $V_{GS}$ of memory device $M_M$ settles to a voltage that ensures that current $I_T$ is equal to current $I_{REF}$. After calibration, switches $S_1$ and $S_3$ are open and the capacitance between the gate terminal and the source terminal of transistor $M_M$ will hold the programmed voltage. The programmed gate-to-source voltage will slowly discharge over time and the $V_{GS}$ voltage of memory device $M_M$ will then need to be periodically refreshed to maintain the total source current $I_T$ at the desired $I_{REF}$ level. Thus, in an array of current source cells, calibration is performed sequentially for each current source cell and is repeated in a periodic fashion to refresh the programmed gate-to-source voltage of memory device $M_M$.

In accordance with the calibration scheme of the present invention, a spare current source cell ("spare cell"), identical to current source cell 100, is incorporated in an array of current source cells to realize background calibration. Thus, in an array of current source cells, the spare current source cell is merely one instance of the current source cells in the array. The calibration scheme of the present invention uses an entire current source cell as the spare cell, instead of merely providing a spare current source to perform the current generating function. By implementing a full current source cell as the spare cell and by using output overrideable latch including an inactive mode, the calibration scheme of the present invention allows calibration of an array of current source cells without interposing switches in the analog signal paths of the current source cells.

Figure 8:
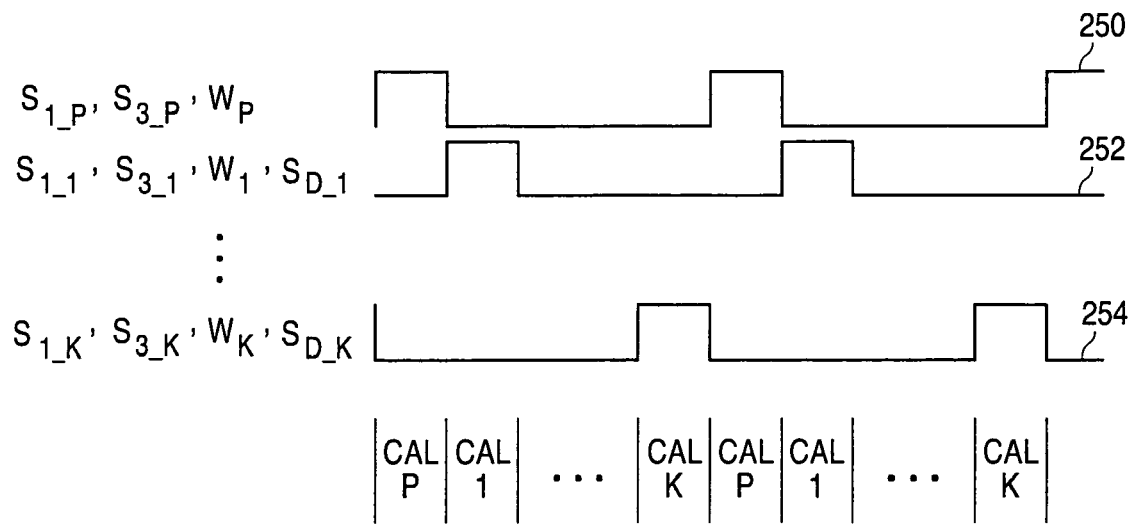
FIG. 8 is a timing diagram for performing the calibration process in the circuit of FIG. 7.
Figure 7:
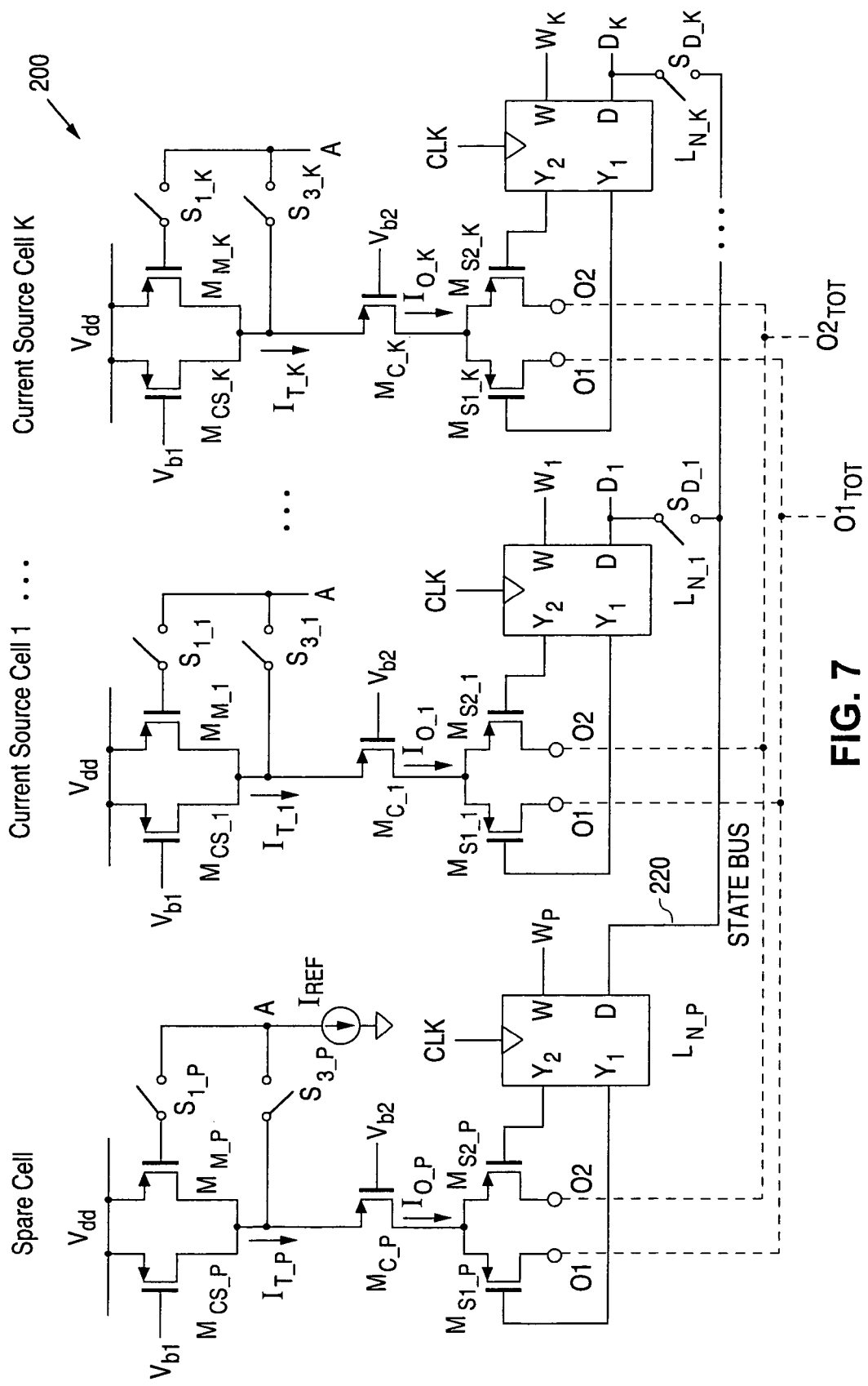
FIG. 7 is a circuit diagram of an array of K current source cells and a single spare current source cell implementing the calibration scheme according to one embodiment of the present invention.

FIG. 7 is a circuit diagram of an array of K current source cells and a single spare current source cell ("spare cell") implementing the calibration scheme according to one embodiment of the present invention. FIG. 8 is a timing diagram for performing the calibration process in the circuit of FIG. 7. Referring to FIG. 7, an array 200 of current source cells includes current source cells 1 to K and a spare cell, all implemented in an identical manner using the circuit configuration of current source cell 100 of FIG. 5. Each current source cell, including the spare cell, operates to generate respective source current $I_T$ using current source device $M_{CS}$ and memory device $M_M$ and further operates to steer respective output source current $I_O$ to one of the two output terminals O1 and O2. The output terminals O1 of all the current source cells, including the spare cell, are connected together into a single array output terminal $O1_{TOT}$. The output terminals O2 of all the current source cells, including the spare cell, are connected together into a single array output terminal $O2_{TOT}$. In other words, all output terminals O1 are shorted together while all output terminals O2 are shorted together. Output terminal $O1_{TOT}$ provides the sum of all currents steered into output terminals O1 in the array of current source cells, including the spare cell. Output terminal $O2_{TOT}$ provides the sum of all currents steered into output terminals O2 in the array of current source cells, including the spare cell.

Current source array 200, as thus configured, implements a current steering digital-to-analog converter. Depending on the state of the digital data bits D1 to DK provided to the current source cells, the output source current $I_O$ of each current source cell is steered into one of the two respective output terminals O1 and O2. The total current values at output terminals $O1_{TOT}$ and $O2_{TOT}$ will be indicative of the digital data to be converted into analog form.

In each current source cell, including the spare cell, a respective $S_1$ switch (switches $S_{1\_P}$, $S_{1\_1}$ to $S_{1\_K}$) and a respective $S_3$ switch (switches $S_{3\_P}$, $S_{3\_1}$ to $S_{3\_K}$) are closed when the current source cell is placed in calibration. By closing switches $S_1$ and $S_3$, the gate and drain terminals of memory device $M_M$ are shorted to node A. A reference current $I_{REF}$ is forced into node A to force the source current $I_T$ to equal to the reference current $I_{REF}$, thereby programming the necessary gate-to-source voltage across the memory device $M_M$ to ensure a constant source current output. When calibration is completed, switches $S_1$ and $S_3$ are open and the current source cell can be operated normally. The calibration process of current source array 200 will be described in more detail below.

Note that in current source array 200, node A is common to all of the current source cells, including the spare cell. In FIG. 7, a reference current source is shown coupled to node A of the spare current source cell. It is understood that because node A is a common node, all of the nodes A of all current source cells, including the spare cell, in the array are connected to the reference current source. Since only one pair of the $S_1$ and $S_3$ switches will be closed at a time, the reference current $I_{REF}$ will be coupled across the gate to drain terminal of only one memory device $M_M$ of one current source cell in the array at a time.

To perform digital-to-analog conversion using current source array 200, digital data bits $D_1$ to $D_K$ are coupled to respective current source cells (cell 1 to cell K). Each data bit $D_1$ to $D_K$ drives a respective output overrideable latch $L_N$ (latches $L_{N\_1}$ to $L_{N\_K}$) of the associated current source cell. In accordance with the calibration scheme of the present invention, data switches $S_{D\_1}$ to $S_{D\_K}$ are included in current source array 200 to switchably connect each of data bits $D_1$ to $D_K$ to a data bus, denoted "state bus" 220. State bus 220 is coupled to the data input terminal of latch $L_{N\_P}$ which is the output overrideable latch associated with the spare cell. By closing one of the data switches $S_{D\_1}$ to $S_{D\_K}$ at a time, the digital data bit coupled to the associated current source cell is also coupled to the spare cell. The incorporation of data switches $S_{D\_1}$ to $S_{D\_K}$ and state bus 200 allows the spare cell to be substituted for the current source cells when a given current source cell is under calibration.

The operation of the calibration scheme of the present invention for calibrating current source array 200 will now be described in conjunction with the timing diagram of FIG. 8. In the present illustration, the spare cell is calibrated first followed by each of the current source cells 1 to K in sequence. The calibration process then repeats to calibrate the spare cell again and so on. In other implementation, other calibration sequence can also be used.

When the spare cell is being calibrated, the output override control signal $W_P$ for latch $L_{N\_P}$ associated with the spare cell is asserted. When the output override control signal $W_P$ is asserted (logical high), the output signals $Y_1$ and $Y_2$ of latch $L_{N\_P}$ are forced to a logical high value, thereby turning off both of the current steering switches $M_{S1\_P}$ and $M_{S2\_P}$ associated with the spare cell. Switches $S_{1\_P}$ and $S_{3\_P}$ are closed to force source current $I_{T\_P}$ to the reference current $I_{REF}$ value. With the current steering switches closed, all the reference current are provided for calibration use only. The spare cell under calibration does not contribute any current to the output terminals regardless of the state of the data input terminal D of latch $L_{N\_P}$. The gate-to-source voltage of memory device $M_{M\_P}$ is thus programmed to a value that would ensure that the source current $I_{T\_P}$ is at the desired reference current $I_{REF}$ value.

While the spare cell is being calibrated, the $S_1$ switches ($S_{1\_1}$ to $S_{1\_K}$) and the $S_3$ switches ($S_{3\_1}$ to $S_{3\_K}$) of current source cell 1 to current source cell K are all open and the data switches ($S_{D\_1}$ to $S_{D\_K}$) are also all open so that state bus 220 is not driven. The output override control signals $W_1$ to $W_K$ are all deasserted to allow current source cell 1 to current source cell K to operate in a normal mode. When the output override control signals $W_1$ to $W_K$ are deasserted, latches $L_{N\_1}$ to $L_{N\_K}$ operate as a normal data latch where the output signals $Y_1$ and $Y_2$ follows the data input signal at the transitions of the CLK signal. The K current source cells of array 200 thereby perform data conversion based on digital data bits $D_1$ to $D_K$.

When the calibration of the spare cell is completed, switches $S_{1\_P}$ and $S_{3\_P}$ open and the output override control signal $W_P$ is deasserted. The calibration process continues with the calibration of the K current source cells in array 200. During the calibration of a given current source cell, the pre-calibrated spare cell is substituted for the current source cell under calibration so that the digital-to-analog conversion operation of the array is not affected by the calibration operation. In the calibration scheme of the present invention, the spare cell does not merely provides the output source current but rather includes the entire circuitry for implementing a current source cell. Therefore, when the spare cell is used to substitute a current source cell under calibration, the spare cell performs the entire function of the substituted current source cell and the substituted current source cell does not contribute to the output current values.

After the spare cell is calibrated, current source cell 1 is now calibrated. Switches $S_{1\_1}$ and $S_{3\_1}$ are closed to couple the gate and drain terminals of memory device $M_{M\_1}$ to node A. The reference current $I_{REF}$ is thus forced into the gate and drain terminals of memory device $M_{M\_1}$ and current $I_{T\_1}$ is forced to current $I_{REF}$. At the same time, the output override control signal $W_1$ for latch $L_{N\_1}$ associated with current source cell 1 is asserted to force output signals $Y_1$ and $Y_2$ to a logical high state, thereby turning off both of the current steering switches $M_{S1\_1}$ and $M_{S2\_1}$ associated with current source cell 1. In this manner, the gate-to-source voltage of memory device $M_{M\_1}$ is thus programmed to a value that would ensure that the source current $I_{T\_1}$ is at the desired reference current $I_{REF}$ value.

While current source cell 1 is being calibrated, the current steering switches $M_{S1\_1}$ and $M_{S2\_1}$ are both turned off so that current source cell 1 does not contribute any current to the output terminals. Instead, the spare cell is substituted for current source cell 1. Thus, when current source cell 1 is being calibrated, all data switches are open except for data switch $S_{D\_1}$ which is closed. The digital data signal $D_1$, associated with current source cell 1, is then connected through data switch $S_{D\_1}$ to state bus 220 and subsequently to the data input terminal of latch $L_{N\_P}$ of the spare cell. The spare cell, with the output override control signal $W_P$ being deasserted, operates in a normal, active mode to steer the source current $I_{T\_P}$ into one of its two output terminals O1 and O2 based on the digital data signal $D_1$. The output currents from the spare cell will be summed with the output currents from the other active current source cells as the O1 and O2 output terminals are connected together respectively. In this manner, the spare cell replaces current source cell 1 while current source cell 1 is being calibrated.

When the calibration of source cell 1 is completed, the calibration process proceeds to calibrate current source cell 2 and so on in the same manner as described above. For each current source cell in cells 1–K being calibrated, the spare cell is substituted for the cell being calibrated. Thus, the output override control signal $W_N$ of the cell being calibrated is asserted to disable the current steering switches so that the cell being calibrated no longer contribute to the output current values. Instead, the digital data signal intended for the cell being calibrated is routed through the respective data switch to state bus 200 and onto the spare cell. The spare cell, receiving the digital data signal, operates to provide output current values at its output terminals O1 and O2 based on the received digital data signal in the same manner as the cell being calibrated. Thus, current source array 200 can be calibrated without impeding the normal digital-to-analog operation of the array. In fact, current source array 200 can be calibrated periodically in a sequential fashion while the converter operates normally to perform digital-to-analog conversion.

Figure 9:
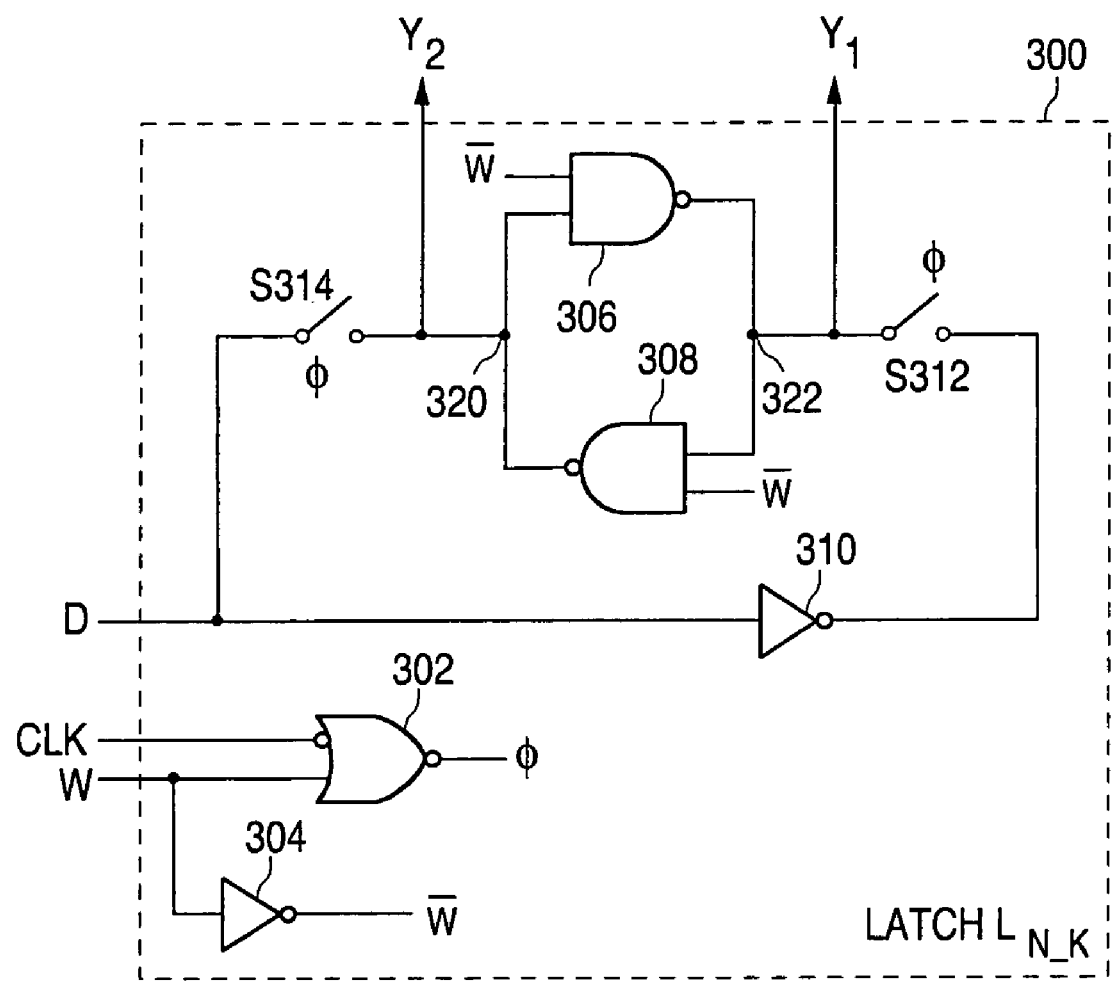
FIG. 9 is a detailed circuit diagram of the output overrideable latch $L_{N\_K}$ according to one embodiment of the present invention.

FIG. 9 is a detailed circuit diagram of an output overrideable latch circuit which can be used to implement latch $L_{N\_K}$ in the current source cell according to one embodiment of the present invention. Referring to FIG. 9, latch circuit 300 includes a NOR gate 302 receiving an inverse of the clock signal CLK as a first input and an output override control signal W as a second input. NOR gate 302 provides signal φ as an output signal. Basically, signal φ follows clock signal CLK when output override control signal W is not asserted. In the present embodiment, output override control signal W is not asserted when it is at a logical low. Signal φ is forced to a logical low value when output override control signal W is asserted (at a logical high state). An inverter 304 is included to provide an inverted version (W\) of the output override control signal W.

Signal φ is used to control switches S312 and S314. Switches S312 and S314 are open when signal φ is at a logical low state and are closed when signal φ are at a logical high state. Latch circuit 300 receives a data input signal D which is coupled to a first switch terminal of switch S314 and also coupled to an inverter 310. An inverted data signal from inverter 310 is coupled to a first switch terminal of switch S312. The second switch terminals of switches S312 and S314 are coupled to a pair of back-to-back connected NAND gates 306 and 308. Specifically, NAND gate 306 has a first input terminal coupled to receive the inverted control signal W\ and a second input terminal coupled to a node 320 which is the second switch terminal of switch S314. The output terminal of NAND gate 306 drives a node 322 which is the second switch terminal of switch S312. Similarly, NAND gate 308 has a first input terminal coupled to receive the inverted control signal W\ and a second input terminal coupled to node 322 which is the second switch terminal of switch S312. The output terminal of NAND gate 308 drives node 320 which is the second switch terminal of switch S314. Node 322 provides the first output signal $Y_1$ of latch circuit 300 while node 320 provides the second output signal $Y_2$ of latch circuit 300.

First, the operation of latch circuit 300 when the output override control signal W is asserted (logical high) is described. When control signal W is asserted, signal φ is forced to a logical low state, thereby opening switches S312 and S314. The inverted control signal W\, at a logical low state, is coupled to NAND gate 306 and 308 to force the output of both NAND gates to a logical high. In this manner, when the output override control signal W is asserted, output signals $Y_1$ and $Y_2$ of latch circuit 300 are forced to logical high states, in accordance with the truth table of FIG. 6.

The operation of latch circuit 300 when the output override control signal W is deasserted (logical low) is now described. When control signal W is deasserted, signal φ follows clock signal CLK. Switches S312 and S314 close when clock signal CLK is at a logical high and open when clock signal CLK is at a logical low. Latch circuit 300 thereby latches the data on the data input terminal at the rising edge of clock signal CLK and the latched data is held until the next rising edge of clock signal CLK. When control signal W is deasserted, the inverted control signal W\ is at a logical high and NAND gates 306 and 308 function as inverters. The back-to-back connection of NAND gates 306 and 308 thus forms an inverter loop driving output signal $Y_1$ at node 322 to the inverse of the data input value and driving the output signal $Y_2$ at node 320 to the data input value. In this manner, latch circuit 300 implements the truth table for latch $L_{N\_K}$ shown in FIG. 6.

Latch circuit 300 of FIG. 9 is an exemplary embodiment of an output overrideable latch which can be used to implement the latch $L_{N\_K}$ in the current source array of FIG. 7 to facilitate the calibration scheme of the present invention. One of ordinary skill in the art would appreciate that other implementations for the output overrideable latch are possible in order to implement the truth table for the output overrideable latch in FIG. 6.

The current source array of the present invention, implemented using an output overrideable latch circuit, enables calibration of the current source array using a calibration scheme that overcomes many of the disadvantages of the conventional calibration methods. First, by providing a current source cell that does not use switches in the path of the analog current, all the limitations associated with using switches, such as capacitance coupling, voltage drops across the switches, and other nonideal characteristics that degrade the performance of the digital-to-analog converter, are avoided.

Second, by eliminating the switches and the wiring required to route the spare source current to each of the current source cells, the current source array of the present invention can ensure high quality performance even at high frequency. The introduction of the state bus adds little or no burden on the digital-to-analog conversion operation. In particular, any timing accuracy issue on the digital code fed to the state bus can be effectively corrected by the output overrideable latch itself provided that the state bus signal is compatible with the set up and hold timing restrictions of the output override latch circuit. Furthermore, the routing of the data signals for calibration occurs on the state bus which is a digital bus and is therefore more noise tolerant.

In FIG. 7, current source array 200 includes K number of current source cells and one spare cell. The configuration of current source array 200 is illustrative only and one of ordinary skill in the art, upon being apprised of the present invention, would appreciate that the current source array can be configured in other manners, such as by including any number of one or more current source cells and including any number of one or more spare current source cells. For instance, a current source array of M numbers of current source cells and P number of spare cells with each spare cell disposed to substitute for a subset of the M current source cells. The current source array will then have multiple state busses with each state bus connecting one spare cell to the associated set of current source cells in the array.

The above detailed descriptions are provided to illustrate specific embodiments of the present invention and are not intended to be limiting. Numerous modifications and variations within the scope of the present invention are possible. For example, the current source in the current source cell providing the source current can be implemented using a variety of current source circuits and a variety of output devices. The current source for use in the current source cell only needs to be one that can be calibrated to provide a substantially constant output current. The output device for the current source can be an NMOS transistor or an N-type or P-type bipolar transistor. The present invention is defined by the appended claims.

I claim:

1. A current source cell comprising:
a current source providing a first current to a first node, the current source being capable of being calibrated to provide the first current having a substantially constant value;
a first switch coupled between the first node and a first output terminal and having a control terminal driven by a first control signal;
a second switch coupled between the first node and a second output terminal and having a control terminal driven by a second control signal; and
a latch circuit receiving a data signal, an output override control signal, and a clock signal, the latch circuit generating the first control signal and the second control signal as output signals,
wherein when the output override control signal is asserted, the first control signal and the second control signal are driven by the latch circuit to a first logical state to cause the first and second switches to open; and when the output override control signal is deasserted, the first control signal and the second control signal are driven by the latch circuit to have logical states that correspond to the data signal as triggered by the clock signal where the first and second control signals have inverse logical states, thereby causing one of the first and second switches to close to steer the first current to a respective one of the first and second output terminals.

2. The current source cell of claim 1, wherein the current source comprises:
a first transistor having a first current handling terminal coupled to a first supply voltage, a second current handling terminal coupled to a second node and a control terminal coupled to a first voltage to bias the first transistor for providing a first portion of a second current;
a second transistor having a first current handling terminal coupled to the first supply voltage, a second current handling terminal coupled to the second node and a control terminal, the second current handling terminal and the control terminal being switchably connected to a reference current, the second transistor being periodically biased by the reference current for providing a second portion of the second current, the second portion of the second current being varied to keep the second current at the second node at a substantially constant level; and
an output device coupled between the second node and the first node, the output device receiving the second current and providing the first current at the first node, the first current being proportional to the second current.

3. The current source cell of claim 2, wherein the output device comprises a third transistor having a first current handling terminal coupled to the second node, a second current handling terminal coupled to the first node, and a control terminal coupled to a third voltage.

4. The current source cell of claim 3, wherein the first, second, and third transistors comprise MOS transistors.

5. The current source cell of claim 1, wherein:
the first switch comprises a first transistor having a control terminal driven by the first control signal, a first current handling terminal coupled to the first node and a second current handling terminal coupled to the first output terminal; and
the second switch comprises a second transistor having a control terminal driven by the second control signal, a first current handling terminal coupled to the first node and a second current handling terminal coupled to the second output terminal,
wherein the first and second control signals are applied to either open both of the first and second switches or a selected one of the first and second switches.

6. The current source cell of claim 5, wherein the first transistor and the second transistor each comprises an MOS transistor.

7. A current source array, comprising:
one or more current source cells and at least one spare current source cell ("spare cell"), each of the one or more current source cells and the at least one spare cell comprising:
a current source providing a first current to a first node, the current source being capable of being calibrated to provide the first current having a substantially constant value;

a first switch coupled between the first node and a first output terminal and having a control terminal driven by a first control signal;

a second switch coupled between the first node and a second output terminal and having a control terminal driven by a second control signal; and a latch circuit having a data input terminal receiving a data signal, a control terminal receiving an output override control signal, and a clock terminal receiving a clock signal, the latch circuit generating the first control signal and the second control signal as output signals, wherein when the output override control signal is asserted, the first control signal and the second control signal are driven by the latch circuit to a first logical state to cause the first and second switches to open; and when the output override control signal is deasserted, the first control signal and the second control signal are driven by the latch circuit to have logical states that correspond to the data signal as triggered by the clock signal where the first and second control signals have inverse logical states, thereby causing one of the first and second switches to close to steer the first current to a respective one of the first and second output terminals;

wherein each of the one or more current source cells and the spare cell receives a respective output override control signal and each of the one or more current source cells receives a respective data signal;

a data bus coupled to the data input terminal of the latch circuit of the spare cell and switchably coupled to the data input terminals of the latch circuits of the one or more current source cells;

a first array output terminal connecting the first output terminals of the one or more current source cells and the at least one spare cell together providing a first output current; and a second array output terminal connecting the second output terminals of the one or more current source cells and the at least one spare cell together providing a second output current;

wherein each of the one or more current source cells is calibrated in turn to maintain the first current of each current source cell at a substantially constant value, the current source cell being calibrated is disabled by asserting the output override control signal to cause the first and second switches of the current source cell under calibration to open and the spare cell is activated to substitute for the current source cell being calibrated by deasserting the output override control signal for the latch circuit of the spare cell and connecting the data input terminal of the latch circuit of the current source cell being calibrated to the data bus.

8. The current source array of claim 7, wherein the spare current source cell is calibrated to maintain the first current of the spare current source cell at a substantially constant value, the spare current source cell being calibrated is disabled by asserting the output override control signal to cause the first and second switches of the spare current source cell under calibration to open.

9. The current source array of claim 7, wherein the current source in each of the one or more current source cells and the spare cell comprises:

a first transistor having a first current handling terminal coupled to a first supply voltage, a second current handling terminal coupled to a second node and a control terminal coupled to a first voltage to bias the first transistor for providing a first portion of a second current;

a second transistor having a first current handling terminal coupled to the first supply voltage, a second current handling terminal coupled to the second node and a control terminal, the second current handling terminal and the control terminal being switchably connected to a reference current, the second transistor being periodically biased by the reference current for providing a second portion of the second current, the second portion of the second current being varied to keep the second current at the second node at a substantially constant level; and an output device coupled between the second node and the first node, the output device receiving the second current and providing the first current at the first node, the first current being proportional to the second current.

10. The current source array of claim 9, wherein the output device comprises a third transistor having a first current handling terminal coupled to the second node, a second current handling terminal coupled to the first node, and a control terminal coupled to a third voltage.

11. The current source array of claim 10, wherein the first, second, and third transistors comprise MOS transistors.

12. The current source array of claim 7, wherein the data bus is switchably coupled to the data input terminals of the latch circuits of the one or more current source cells by a plurality of data switches, each of the plurality of data switches switchably connecting a respective data input terminal of the latch circuit associated with a respective one of the one or more current source cells to the data bus.

13. The current source array of claim 7, wherein the first switch and the second switch in each of the one or more current source cells and the spare cell comprise:

the first switch comprises a first transistor having a control terminal driven by the first control signal, a first current handling terminal coupled to the first node and a second current handling terminal coupled to the first output terminal; and the second switch comprises a second transistor having a control terminal driven by the second control signal, a first current handling terminal coupled to the first node and a second current handling terminal coupled to the second output terminal, wherein the first and second control signals are applied to either open both of the first and second switches or a selected one of the first and second switches.

14. The current source cell of claim 5, wherein the first transistor and the second transistor each comprises an MOS transistor.

15. A method for calibrating a current source cell, comprising:

providing a first current at a first node, the first current being capable of being calibrated to maintain the first current at a substantially constant value;

steering the first current to a selected one of first and second current paths in accordance with a data signal, the first current path being controlled by a first control signal and the second current path being controlled by a second control signal;

asserting the first and second control signals to disable the first and second current paths;

calibrating the first current to maintain the first current at a substantially constant value; and after the first current is calibrated, asserting one of the first and second control signals in accordance with the data signal to steer the first current to a selected one of first and second current paths.

16. The method of claim 15, further comprising:

generating the first and second control signals using a latch circuit, the latch circuit receiving an output override control signal and the data signal;

asserting the output override control signal to cause the first and second control signals to be asserted to disable the first and second current paths; and deasserting the output override control signal to cause the first and second control signals to have logical states that correspond to the data signal, the first and second control signals having inverse logical states.

17. A method for calibrating a current source array, comprising:

providing one or more current source cells and at least one spare current source cell ("spare cell") to form the current source array, each of the one or more current source cells and the at least one spare cell providing a first current at a first node, the first current being capable of being calibrated to maintain the first current at a substantially constant value;

in each of the one or more current source cells and the at least one spare cell, steering the first current to a selected one of first and second current paths in accordance with a data signal, the first current path being controlled by a first control signal and the second current path being controlled by a second control signal;

providing a respective data signal to each of the one or more current source cells;

summing the current in the first current paths of the one or more current source cells and the at least one spare cell as a first output signal;

summing the current in the second current paths of the one or more current source cells and the at least one spare cell as a second output signal;

calibrating the first current of each of the one or more current source cells in turn, comprising:

asserting the first and second control signals associated with the current source cell being calibrated to disable the first and second current paths of the current source cell being calibrated;

calibrating the first current of the current source cell being calibrated to maintain the first current at a substantially constant value;

coupling the data signal associated with the current source cell being calibrated to the spare cell as the data signal of the spare cell;

asserting one of the first and second control signals of the spare cell in accordance with the data signal to steer the first current to a selected one of first and second current paths of the spare cell;

after the first current of the current source cell being calibrated is calibrated, decoupling the data signal associated with the calibrated current source cell from the spare cell;

asserting one of the first and second control signals of the calibrated current source cell in accordance with the respective data signal to steer the first current to a selected one of first and second current paths of the calibrated current source cell.

18. The method of claim 17, further comprising:

in each of the one or more current source cells and the at least one spare cell, generating the first and second control signals using a latch circuit, the latch circuit receiving an output override control signal and the data signal;

providing a respective output override control signal to each of the one or more current source cells and the at least one spare cell;

in a current source cell being calibrated, asserting the output override control signal to cause the first and second control signals to be asserted to disable the first and second current paths; and in a calibrated current source cell, deasserting the output override control signal to cause the first and second control signals to have logical states that correspond to the data signal, the first and second control signals having inverse logical states.

19. The method of claim 18, further comprising calibrating the spare current source cell to maintain the first current of the spare current source cell at a substantially constant value, calibrating the spare current source cell comprising:

asserting the first and second control signals associated with the spare current source cell to disable the first and second current paths of the spare current source cell; and calibrating the first current of the spare current source cell to maintain the first current at a substantially constant value.

20. The method of claim 19, wherein calibrating the spare current source cell comprises:

asserting the output override control signal of the spare current source cell to cause the first and second control signals of the spare current source cell to be asserted to disable the first and second current paths; and deasserting the output override control signal of the spare current source cell to cause the first and second control signals to have logical states that correspond to a data signal coupled to the spare current source cell, the first and second control signals having inverse logical states.

* * * * *